Oct. 6, 1970 J. P. FAULKNER 3,532,801
METHOD AND APPARATUS FOR FABRICATING LAMINATED CIRCUIT BOARDS
Filed Feb. 23, 1965 2 Sheets-Sheet 1

INVENTOR.
JOHN P. FAULKNER
BY
Christie, Parker & Hale
ATTORNEYS.

Oct. 6, 1970 J. P. FAULKNER 3,532,801

METHOD AND APPARATUS FOR FABRICATING LAMINATED CIRCUIT BOARDS

Filed Feb. 23, 1965 2 Sheets-Sheet 2

INVENTOR.
JOHN P. FAULKNER
BY
Christie, Parker & Hale
ATTORNEYS.

United States Patent Office 3,532,801

Patented Oct. 6, 1970

3,532,801

METHOD AND APPARATUS FOR FABRICATING LAMINATED CIRCUIT BOARDS

John P. Faulkner, Pasadena, Calif., assignor to Burroughs Corporation, Detroit, Mich., a corporation of Michigan Filed Feb. 23, 1965, Ser. No. 434,346
Int. Cl. H05k *1/04, 3/00*
U.S. Cl. 174—68.5 11 Claims

ABSTRACT OF THE DISCLOSURE

A method and apparatus for fabricating an improved multilayer electrical circuit board in which circuits in respective layers are selectively interconnected by conductive material deposited within holes in the boards which have a high ratio of length to diameter. After being drilled, the holes are etched after which palladium is deposited by displacement deposition on the circuits intersected by the holes, electroless copper is then deposited in the holes on both the palladium and on the board surfaces, and electroplated copper is then deposited on the electroless copper. Etching, deposition and electroplating is effected by immersion of a board in solutions of predetermined composition coupled with motion of the board parallel to the axes of the holes to force solution therethrough. The electroplated copper locks the layers together by extending within notches formed in the interconnected circuits during the etching operation.

This invention relates to the method and apparatus for fabricating laminated electrical circuit boards which are selectively interconnected.

In the past, the electroplating process has been used to interconnect a series of conventional printed circuit boards formed as laminae. Usually the procedure included perforating the individual circuit boards such that the perforations would penetrate the circuits. After the boards were stacked one upon the other, a conductive film was formed through the holes by electroless deposition of a metal and the electroplating process would thereafter be used to deposit a thin layer of conductive metallic film within the perforation and thereby connect the pierced printed circuits. Electroplating procedures heretofore known have been limited in the size of holes which can be successfully electroplated with any degree of success. Both the size and the length of a perforation affect the amount of material plated on the surface of the perforation. Generally, the relation of a hole diameter to its length has been limited to a ratio of 1:3 for successful electroplating. It has been quite difficult to electroplate through very small holes, say, .015 inch and smaller, regardless of the thickness of the panel on any commercial basis. Furthermore, the plating of the surface of perforations of .015 inch and smaller in panels having a thickness of .100 inch or more, has been considered by some printed circuit board fabricators to be impossible.

The present invention eliminates many of the limitations in the art of plating the surfaces of perforations in panels such as laminated circuit boards by forcing plating solution within and through the perforations. This permits the deposition of a metallic film in perforations in which the diameter to length ratio of the perforation is 1:8.

One aspect of the invention is directed to a method for fabricating a printed circuit board in which the board is marked with at least two registration points and a printed circuit is designed relative to the same registration points. The printed circuit is aligned upon the board relative to the registration points and disposed thereon. In another embodiment of the invention, a series of printed circuit boards would each have registration points in the form of registration holes such that the boards may be stacked upon each other. An alignment device, say a pin, is passed through the registration holes. The boards are bonded together and the pin prevents the boards from shifting relative to each other. The bonding requires only the application of heat and pressure to the boards if the base material of the board is thermoplastic such as "FEP Teflon"; but requires that layers of an uncured bonding agent such as "B stage" epoxy interleave the boards if the base material is a thermosetting plastic such as epoxy.

One aspect of the invention is directed to a process of laminating a plurality of circuit boards formed from an insulated panel with a continuous circuit thereon such that the boards are orientated relative to each other and selectively interconnected with each other. The steps of the process include mounting a plurality of circuit boards one upon the other with a registration hole in each board aligned relative to each adjacent board. The laminated circuit boards are formed into an integral unit and thereafter perforated to intersect certain of the circuits formed on the circuit boards. The laminated circuit boards are etched in the area of the perforation to an extent that the conductive circuits in the vicinity of the perforations are etched to a greater extent than the insulated panels to form a series of notches in the vicinity of the conductive circuits. A metallic conductor is deposited within the laminae in the form of a thin layer that extends within the notches formed in the perforation and is locked therein to thereby electrically couple selected circuits together.

In a presently preferred embodiment, the conductive film deposited in a laminae perforation is formed from a series of particular metals that readily are secured to a copper circuit. The film includes a layer of displacement deposited palladium directly in contact with the copper circuits. Although the use of palladium for this layer is advisable because of cost considerations, any metal which is more noble than palladium, i.e., which would not displace palladium, may be used. A layer of electroless deposited copper is disposed upon both the palladium layer and the plastic surface which is exposed within the perforation. Finally, a layer of electroplated copper envelops the electroless deposited copper to thus electrically couple selected circuits in the laminated circuit boards.

This invention will become more apparent after considering the following description and the drawings in which.

Figure 1:
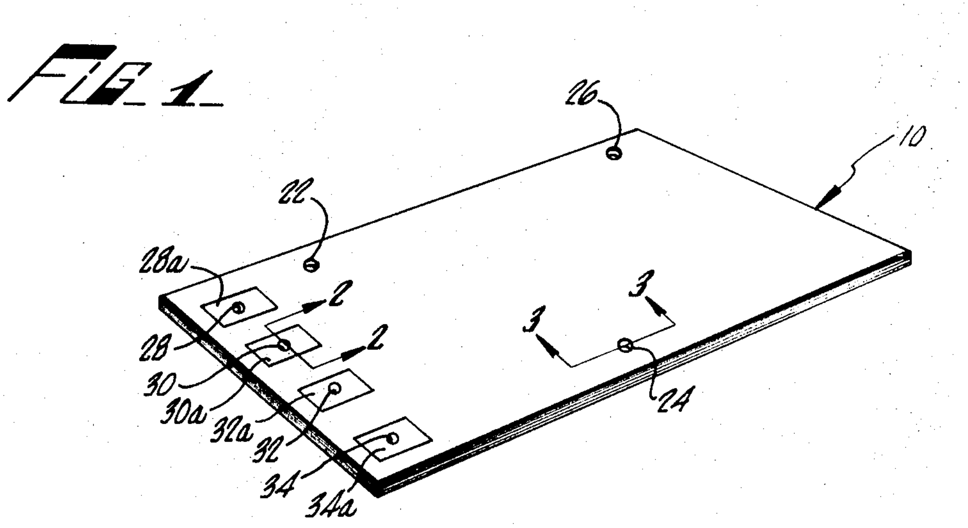
FIG. 1 is a perspective view of laminated circuit boards constructed in accordance with the present invention.
Figure 2:
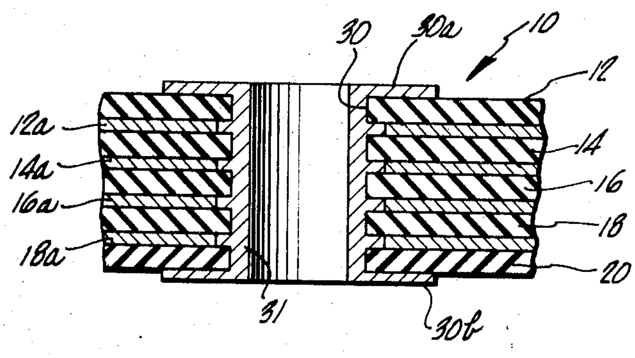
FIG. 2 is a cross-sectional view taken along line 2—2 of FIG. 1 through colinear perforations in the laminated circuit boards illustrating how the selected circuits are interconnected.

Referring now to FIGS. 1–5, laminae 10 include a series of individual printed circuit boards 12, 14, 16, 18, and 20 all formed into an integral unit. A series of registration holes 22, 24, and 26 extend through the laminae 10 in three distinct spaced positions. A plurality of spaced perforations 28, 30, 32, and 34, penetrate the laminae 10 and interconnect a series of printed circuits 12A, 14A, 16A, as best illustrated in FIG. 2. A conductive metallic film 31 serves to electrically couple the printed circuits 12A, 14A, 16A together and extends the length of the perforation 30 terminating on opposite sides of the laminae 10 in a pair of pads 30A and 30B which may be used for electrically connecting the printed circuits within the laminae to other devices (not shown). Each of the remaining perforations 28, 32 and 34 has a respective pad 28A, 32A, and 34A defining a conductive surface which may be used to connect the circuits to other electrical devices (not shown).

Figure 3:
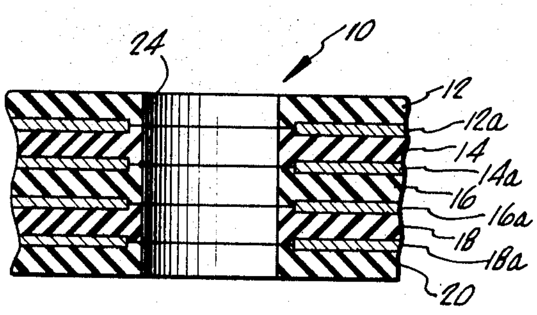
FIG. 3 is a cross-sectional view taken along line 3—3 of FIG. 1 through registration holes of the laminated circuit boards illustrated in FIG. 1.

Referring to FIGS. 1 and 3, the registration holes 22, 24, and 26 formed in the laminae preferably do not interconnect or penetrate any portion of the printed circuits on the laminated circuit boards.

The construction of the laminae 10 will be better understood by considering the process by which it is made which will now be described.

Each of the printed circuit boards is formed from an insulated panel 12, 14, 16, 18 which is predrilled with the series of registration holes 22, 24, and 26 before the respective printed circuits 12A, 14A, 16A, 18A are mounted thereon. Preferably, the printed circuits are photoetched with the position of the circuit located relative to the registration holes. The methods of mounting a printed circuit upon a circuit board are very well-known in the art and will not be disclosed in detail for that reason. For example, the printed circuit may be formed by the well-known photoetching process in which the metal clad board is photosensitized and a negative is placed upon the board which, in this case, is located relative to the registration holes and then exposed to a light source. In this process the photographic negative used in photoprinting the circuit is designed so that only that portion of the photo resist which covers the copper circuits which are to remain on the finished board are exposed to light. The portions of the resist which are exposed to light become resistant to both the solvent used to remove the unexposed portions and to a subsequently applied copper etchant. The unexposed portions are then removed by the solvent to leave a pattern of exposed resist protecting those portions of the copper cladding which are to remain on the finished board to form the circuits. The board is then etched by immersion in or spraying with a suitable etching solution such as ferric chloride. This etching is usually done by spraying. The unprotected copper is dissolved away to leave only the circuit configuration which is protected by the resist. No electroplating operation is used. The exposed photoresist is then stripped from the boards by organic solvents which swell the photoresist to break the bond between the resist and the metal and permit the resist to slough off.

The individual circuit boards 12, 14, 16, 18 and 20 are mounted one upon the other with the respective registration holes 22, 24, 26, all aligned with each other and preferably with an alignment pin (not shown) extending through all the boards. Thus, the circuits and each respective board are all located with the same coordinates and thus each printed circuit is located in a known relation with each other printed circuit.

While not shown, a ground plate may be used on the side of each circuit board opposite the printed circuit and is used as an internal ground. The layers would be oriented so that there is always a ground plate between adjacent circuit layers. An insulating sheet (not shown) would be inserted between each individual printed circuit board to prevent electrically shorting adjacent printed circuits against the ground plate.

Alternatively, board stock clad on both sides with copper may have circuits etched on both sides of the individual boards when ground plates are not included. The individual boards may then be interleaved with sheets of "B stage" epoxy glass and laminated into a single block.

In the preferred embodiment of the present invention, printed circuit boards are formed with an epoxy resin-glass fiber reinforced stock having a thickness of .003 inch to .004 inch. The particular thickness used is not important and will differ in various applications. It may be as small as .0025 inch in some cases while in other cases will be much greater. In the event insulated sheets are used between each individual printed circuit board, they are preferably formed from an epoxy resin-glass fiber reinforced sheet with the resin in the "B stage" which is quite well-known in the art as being a resin which is dried but in the uncured stage. After the printed circuits and any insulating boards are mounted one upon the other on locating pins passing through all of the registration holes, the laminae 10 are then placed in a fixture (not shown) and heated to a temperature of 325° F. and pressure of 200 p.s.i. is applied and maintained for a period of 30–35 minutes. The time temperature and pressure stated were found satisfactory for the particular materials used. They will, however, vary with the raw materials used. The fixture and laminae are chilled to near room temperature. It is to be noted that normally the laminae fixture would be larger in area than the laminae and the pressure designated is the total pressure in pounds per square inch for the area of the laminae.

The perforations 28, 30, 32 and 34 are now formed by drilling or piercing the laminae in such position that at least two of the printed circuits are penetrated by the perforations. It has been found that it is best to locate the performations relative to the registration holes. In those cases where the circuit on one or more circuit boards is not to be interconnected with the other circuits in the laminae, the circuit is designed to avoid the area around the perforation and thereby will not be pierced. In this manner, preselected circuits in the laminae may be interconnected by using the invention. The perforations are preferably drilled while using glycerin as a lubricant since it is water soluble and may be easily removed after the drilling operation.

For best results, cleanliness must be maintained throughout the entire operation.

The laminae 10 are thoroughly cleaned in a mild alkaline detergent and very thoroughly rinsed with deionized water. An example of a suitable detergent is given below.

| | | |
|---|---|---|
| Trisodium phosphate $Na_3PO_4.12H_2O$ | grams/liter__ | 5.0 |
| Sodium pyrophosphate $Na_4P_2O_7$ | do____ | 15.0 |
| Sodium tripolyphosphate $Na_2P_3O_{10}$ | do____ | 10 |
| Monosodium phosphate $NaH_2PO_4$ | do____ | 1.6 |
| Tergitol nonionix NPX—a surface active agent (product Union Carbide Chemical Co.) | ml./liter__ | 1.0 |

| | | |
|---|---|---|
| Deionized water | | Balance |
| Operating temperature | ° F. | 130–140 |

Figure 5:
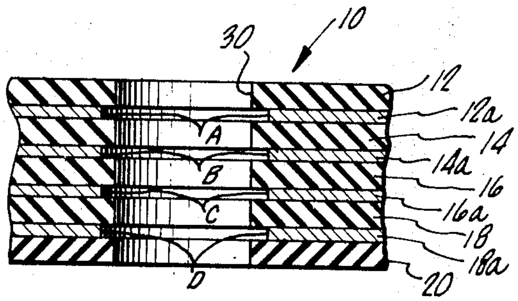
FIG. 5 is a cross-sectional view taken along line 2—2 of FIG. 1 through perforations in the laminated circuit boards showing the notches formed during the etching step in the process in accordance with the present invention.

The laminae 10 are then etched in a solution of the following composition for a period of 30 minutes to remove any glass fibers which extend within the perforations 28, 30, 32, and 34 in the case of a glass fiber laminated circuit board and also to roughen the interior of the perforations and to form the notches in the perforations as illustrated in FIG. 5. The composition of the etching solution is as follows:

| | Ml./liter |
|---|---|
| Hydrofluoric acid, 49% HF | 100–200 |
| Deionized water | Balance |

During the etching operation, the laminae 10 are moved through the solution in a direction parallel to the axis of the perforations 28, 30, 32, and 34 to force the etching solution through the perforations. After etching, the laminae are thoroughly rinsed with deionized water and the holes are then blown out with clean air. It is well to note that the air used to clean out the perforations is preferably not the conventional compressed air used in most manufacturing plants. This type of air generally has trace amounts of oil and is not suitable since the oil is deposited within the perforations and prevents the proper deposition of a metallic film through the perforations.

Figures 4, 6, 7:
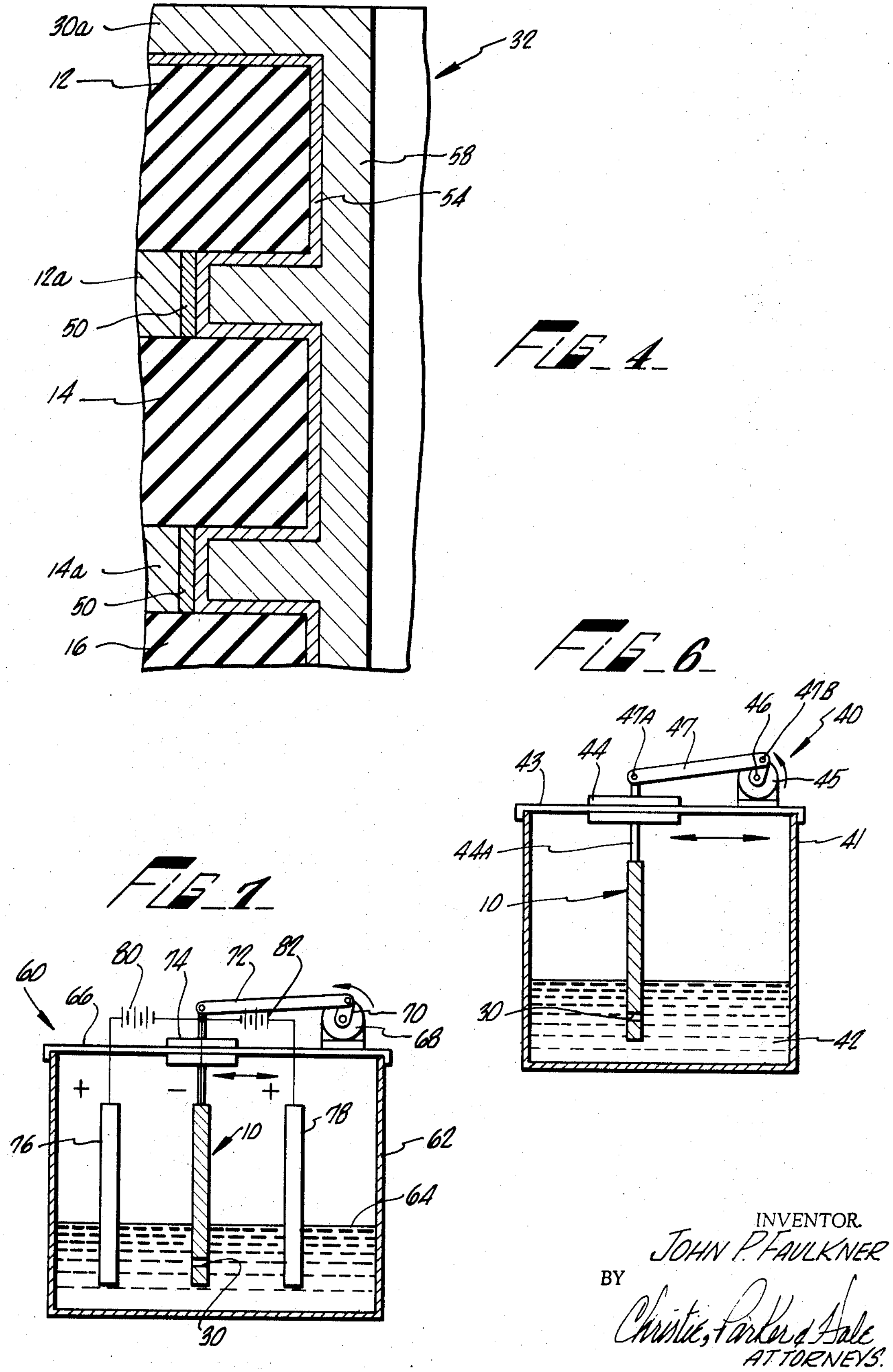
FIG. 4 is a partial enlarged cross-sectional view of the perforation illustrated in FIG. 2.
FIG. 6 illustrates a schematic view of an electroless deposition tank in which a laminated circuit board is mounted in accordance with the present inventon.
FIG. 7 is a schematic view of an electroplating tank having a laminated circuit board mounted therein in accordance with the present invention.

An example of an apparatus suitable for moving the laminae parallel to the axis of the perforations is illustrated in FIG 6. Referring now to FIG. 6, an oscillating apparatus 40 includes a tank 41 containing a solution 42 and a track 43 from which is suspended the laminae 10 in such a position that the perforation 30 is disposed below the surface of the solution 42. The track 43 extends across the entire length of the tank 41 and extends over its sides in supporting fashion. A saddle 44 rides along the track 43 and is supported by the track 43. A conventional electric motor 45 is mounted upon the track 43 and has a rotatable arm 46. A connecting link 47 is connected to the saddle through a pin 47A and to the rotatable arm 46 by a pin 47B and serves to transmit motion from the motor 45 to the saddle 44. As the motor 45 is energized, the link 47 and saddle 44 are oscillated as will be the laminae 10 such that the solution 42 is forced through the perforation 30. Thus, the solution which is disposed within the perforation 30 is not stagnant since the solution flows through the perforation as the laminae 10 are oscillated through the solution.

Referring now to FIGS. 1 and 5, the laminae 10 are etched in hydrofluoric acid to such an extent that the surface of each of the perforations 28, 30, 32, and 34 are roughened which aids in bonding a metallic film within the perforations. The hydrofluoric acid etch decomposes a portion of the printed circuits to such an extent that the circuits 12A, 14A, 16A, and 18A are decomposed at a faster rate than the adjacent insulated panels 12, 14, 16, 18, and 20. A series of notches A, B, C, and D are formed between the respective adjacent insulated panels and the purpose of these notches will become hereinafter apparent as serving to lock the metallic conductor layer within the perforation, as best seen in FIG. 2.

The laminae 10 are then etched for a period of one minute in solution of the following composition:

| | Grams/liter |
|---|---|
| Ammonium persulfate $(NH_4)_2S_2O_8$ | 45 |
| Deionized water | Balance |

This etching solution removes any oxide from the exposed printed circuits preparatory to any plating of a metallic film within the perforations, and also increases the depth of the notches within the perforations by etching away additional copper from the edges of the conductors pierced by the perforations. The laminae are mounted within the oscillating apparatus illustrated in FIG. 5, and are moved through the solution in a direction parallel to the axis of the performations to force the solution through the holes. After etching, the laminae 10 are thoroughly rinsed with deionized water.

Referring now to FIG. 4, a thin, separate, respective layer 50 of palladium is deposited on each metallic surface by displacement deposition. This procedure prevents a deposition of poorly bonded particles of palladium in a succeeding step. A preferred solution for depositing the palladium is given below:

| | Grams/liter |
|---|---|
| Palladium chloride $PdCl_2$, (59–60% Pd) | 7.0 |
| Ammonium chloride $Na_4Cl$, reagent | 200.0 |
| Deionized water | Balance |

The solution strikes rapidly to form a bright adherent deposit of palladium when the board is immersed in the solution for 10–15 seconds. The laminae 10 are moved through the solution in a direction parallel to the perforation axis to force the solution through the perforations. A suitable apparatus for oscillating the board with the solution is illustrated in FIG. 6. The laminae are thereafter rinsed thoroughly with deionized water.

The next is to strike all surfaces with an electroless deposition of copper and preparatory to this step, it is necessary to sensitize the laminae. This procedure is well known to those skilled in the art of electroless deposition. There are several approaches, one being to sensitize the laminae with a solution of $SnCl_2$-HCl known as "Enplate" Sensitizer 430. Similar solutions are available from many sources or may be made up from raw materials. Immersion of the laminae for a period of five minutes in the surfactant solution combined with movement of the laminae in a direction parallel to the axis of the perforations by mounting the laminae in the apparatus illustrated in FIG. 6 were found to give good results. The laminae are thereafter rinsed thoroughly with deionized water.

Sensitizing must be followed by activation in a solution of $PdCl_2$-HCl. Immersion for five minutes in a solution known as "Enplate" Activator 440 was found to give good results. Similar solutions are available from many sources or may be made up from raw materials. The immersion was again combined with movement of the laminae in a direction parallel to the axis of the perforations and was again accomplished by use of the appartus illustrated in FIG. 6. The laminae are thereafter thoroughly rinsed in deionized water.

The sensitizer and activator steps just set forth are respectively used to deposit tin and palladium upon all surfaces of the laminae and serve a catalytic effect permitting a layer of electroless deposited copper plate to be uniformly deposited on the surfaces of the laminae. The procedure by which the surfaces are catalyzed to permit subsequent electroless deposition is generally referred to in the art as "seeding." The immersion times for these steps set forth above were found to give good results with the materials used but may vary for other materials. These times may easily be established by the practitioner for a particular material.

The laminae are then immersed in a solution which will electrolessly deposit copper within the perforations 28, 30, 32, and 34. Commercial solutions of this variety are available from many sources; one such source is Enthone, Inc. and the solution is known as "Enplate" CU–400. The laminae are immersed within the solution and moved in a direction parallel to the axis of the perforations for a sufficient time until 30 micro-inches of copper are electrolessly deposited within the perforations. Referring to FIG. 4, a layer 54 of copper is electrolessly deposited over all surfaces. The laminae are thoroughly rinsed with deionized water and immediately moved to the succeeding step in the process.

A layer 58 of electrodeposited copper is disposed within each of the perforations by using a well-known commercial electroplating procedure. A preferred plating solution is cupric pyrophosphate electrolyte for this plating procedure. The thickness of the layer 58 varies with the application and is controlled by the current density and plating time. Thicknesses between 0.7 and 1.5 mils are commonly used.

Referring now to FIG. 7, in the electroplating step the laminae 10 are installed within an electroplating apparatus 60 which includes a tank 62 containing an electrolyte 64. A track 66 extends over the entire length of the tank 62 and has a conventional electric motor 68 mounted upon one end. A rotatable arm 70 extends from the motor 68 which has a link 72 pivotally extending therefrom to transfer motion to a saddle 74 which slides upon the track 66. The laminae 10 are suspended from the saddle 74 and extend within the electrolyte 64 such that the perforation 30 extends below the surface of the electrolyte. A pair of anodes 76 and 78 in the form of copper bars are disposed on opposite sides of the laminae 10 and extend within the electrolyte 64. The anodes 76 and 78 are coupled to the laminae 10 which act as a cathode and through a pair of batteries 80, 82 to complete the circuit. Although a circuit utilizing batteries is shown in FIG. 7 for illustrative purposes, modern practice would replace the batteries with a DC power supply operating from an AC line. The anodes would be connected in parallel to the positive terminal of a rectifier and the cathode would be connected to its negative terminal. Upon energizing the motor 68, the saddle 74, and laminae 10 are reciprocated back and forth such that the electrolyte 64 is repeatedly forced through the perforation 30 to encourage the plating of the copper within the perforation. The laminae are then thoroughly rinsed with deionized water and dried.

By following the processes outlined above, we have found that a perforation as small as 0.015 inch diameter holes may be plated through a ⅛ inch circuit board. This plating process gives a length to diameter ratio of 8:1 which has not heretofore been feasible by the known method of plating.

Although the agitating device shown in FIG. 7 has produced good results in laboratory work, a modified design would probably be preferable for a larger operation. For example, rather than having a cathode suspended from a saddle riding on a track, it may be advantageous to mount a cathode bar on insulated rollers, clamp the cathodes rigidly to the bar and oscillate the entire bar. Such installations are well known. Oscillation would, of course, continue to be along a direction parallel to the drilled holes.

What is claimed is:

1. The process of fabricating a plurality of circuit boards formed from a series of insulated panels each with a circuit thereon such that the boards are oriented relative to each other and the circuits are selectively interconnected with each other comprising the steps of:
- mounting the plurality of circuit boards one upon the other relative to each other,
- forming the laminated circuit boards into an integral unit,
- perforating the laminated circuit boards in such a position so as to intersect certain of the circuits on the circuit boards,
- etching the laminated circuit boards in the area of the perforation to the extent that the circuits in the vicinity of the perforation are etched to a greater extent than the insulated panels to form a series of notches, and the sequential steps of:
  - depositing a thin layer of palladium by displacement deposition on the etched surfaces of the circuits,
  - seeding the circuit boards, and
  - depositing a metallic conductor within the circuit board perforations in the form of a thin layer that extends within the notches formed in the perforation and is locked therein and serves to couple selected circuits together.

2. The process of fabricating a plurality of circuit boards formed from a series of insulated panels each with a circuit thereon such that the boards are oriented relative to each other and the circuits are selectively interconnected with each other comprising the steps of:
- mounting the plurality of circuit boards one upon the other with a registration hole in each board aligned relative to each adjacent board,
- forming the laminated circuit boards into an integral unit,
- perforating the laminated circuit boards in such a position so as to intersect certain of the circuits on the circuit boards,
- etching the laminated circuit boards in the area of the perforation to the extent that the circuits in the vicinity of the perforation are etched to a greater extent than the insulated panels to form a series of notches, and the sequential steps of:
  - depositing a layer of palladium by displacement deposition on the conductive surfaces of the circuits intersected by the perforation,
  - seeding the circuit boards, and
  - depositing a layer of copper within the circuit board perforation to interconnect the selected circuits on the boards, the layer of copper being locked within the perforation notches.

3. The process of fabricating a plurality of circuit boards formed from a series of insulated panels each with a circuit thereon such that the boards are oriented relative to each other and the circuits are selectively interconnected with each other, comprising the steps of:
- mounting the plurality of circuit boards one upon the other with a registration hole in each board aligned relative to each adjacent board,
- forming the laminated circuit boards into an integral unit,
- perforating the laminated circuit boards in such a position so as to intersect certain of the circuits on the circuit boards,
- etching the laminated circuit boards in the area of the perforation to the extent that the circuits in the vicinity of the perforation are etched to a greater extent than the insulated panels to form a series of notches, and the sequential steps of:
  - depositing a thin layer of palladium within the perforation by displacement deposition on the conductive surfaces of circuits intersected by the perforation,
  - seeding the circuit boards,
  - depositing a thin layer of electroless copper on each thin palladium layer and on the surfaces of the insulated panels within the perforation, and
  - depositing an electroplated layer of copper on the circuit board perforations that is locked in the notches formed in the perforations and interconnects certain of the circuits.

4. The processs of fabricating a plurality of circuit boards each formed from an insulated plastic panel with a circuit thereon such that the boards are oriented relative to each other and the circuits are selectively interconnected with each other comprising the steps of:
- mounting the plurality of circuit boards one upon the other with a registration hole in each board aligned relative to each adjacent board,
- heating and compressing the laminated circuit boards into an integral unit,
- perforating the laminated circuit boards in such a position so as to intersect certain of the circuits on the circuit boards,
- etching the laminated circuit boards in the area of the perforation with a hydrofluoric acid solution to the extent that the circuits intersected by the perforation are etched to a greater extent than the insulated panels to form a series of notches in the vicinity of the circuit, etching the laminae perforation surfaces with a deoxidizing solution and the sequential steps of:

depositing a thin layer of palladium within the perforation by displacement deposition on the conductive surfaces of circuits intersected by the perforation, seeding the circuit boards, depositing a thin layer of electroless copper on each thin palladium layer and on the surfaces of the insulated panels within the perforation, and depositing an electroplated layer of copper within the laminae perforation surfaces that extends within and is locked in the notches formed in the perforation and connects the perforated circuits together.

5. A circuit board in which a certain number of circuits are interconnected, the board comprising:

a series of insulated panels each having an electrical circuit on it, the panels having registration openings formed therein being used to align the panels and the circuits relative to each other, each panel having at least one perforation extending through it and arranged to be colinear with the perforations in the other panels when the registration openings of the panels are aligned, each perforation penetrating at least two of the circuits, and a separate continuous conductive film extending within and through each panel perforation, and the film contacting and interconnecting all of the penetrating circuts and terminating on both sides of the perforation in the form of a pad, the film including a displacement deposited layer of palladium adhering to the surfaces of the circuits penetrated by the perforations, a seeded layer of palladium disposed on the surfaces of the insulated panels within the perforation and on the displacement deposited layer, a layer of electroless deposited copper disposed on the seeded palladium layer, and a layer of electroplated copper on the electroless deposited copper layer.

6. A circuit board in which a certain number of circuits are interconnected, the board comprising:

a plurality of insulated panels each having an electrical circuit on it and having at least one perforation extending through the panels and penetrating at least two circuits, and a continuous conductive film extending within and through each panel perforation and contacting all of the penetrated circuits, the film including a displacement deposited layer of palladium adhering to the surfaces of the circuits penetrated by the perforation a seeded layer of palladium disposed on the surface of the insulated panels within the perforation and on the displacement deposited layer, a layer of electroless deposited copper disposed on the seeded palladium layer, and a layer of electroplated copper on the electroless deposited copper layer.

7. A circuit board in which a certain number of circuits are interconnected, the board comprising:

a plurality of insulated panels each having an electrical circuit and having registration holes formed therein which are used to align the panels and the circuits relative to each other, each panel having at least one perforation extending through it and arranged to be colinear with the perforations in the other panels and penetrating at least two circuits, the panel perforation having a series of notches therein adjacent the circuits, a continuous conductive film extending within and through each panel perforation and contacting all of the penetrated circuits and terminating on both sides of the perforation in the form of a pad, the continuous conductive film being locked within the notches, the film including a displacement deposited layer of palladium adhering to the surfaces of the circuits penetrated by the perforation a seeded layer of palladium disposed on the surfaces of the insulated panels within the perforation and on the displacement deposited layer, a layer of electroless deposited copper disposed on the seeded palladium layer, and a layer of electroplated copper on the electroless deposited copper layer.

8. A method for depositing a plating material within openings which pass through a multilayer circuit board having a series of insulated panels, each with a copper circuit thereon, comprising the sequential steps of:

etching the board in the area of the openings with a copper soluble acid solution to the extent that the circuits intersected by the openings are etched to a greater extent that the insulated panels to form a series of notches;

depositing a thin adherent layer of palladium by displacement deposition on the etched surfaces of the circuits;

seeding the panels to catalyze the surfaces of the insulated panels within each opening;

depositing a thin layer of copper by electroless deposition on the palladium layer and on the surfaces of the insulated panels within each opening; and electroplating a layer of copper within each opening which adheres to the electroless deposition, extends within and is locked in the notches formed in the opening and electrically connects the circuits intersected by the opening.

9. A method, according to claim 8, for depositing a plating material within openings which pass through a multilayer circuit board having a series of insulated panels, each with a copper circuit thereon, in which each of the etching, depositing and plating steps is effected by immersion of the board in etching, depositing, and plating solutions, respectively, of predetermined composition; and in which motion is imparted to the board during each of the etching and depositing steps, the motion being in a direction substantially parallel to the axes of the openings to encourage passage of the solution through the

10. A method according to claim 9, for depositing a plating material within openings which pass through a multilayer circuit board having a series of insulated panels, each with a copper circuit thereon, in which the ratio of the thickness of the board to the diameter of the openings exceeds 3:1.

11. A method for depositing a plating material within holes which pass through a multilayer circuit board having a series of insulated panels, each with a copper circuit thereon comprising the sequential steps of:

depositing a thin adherent layer of a metal at least as noble as palladium within the holes by displacement deposition on the surfaces of the circuits intersected by the holes;

seeding the panels to catalyze the surfaces of the insulated panels within each hole;

depositing a thin layer of copper by electroless deposition on the thin adherent metal layer and on the surfaces of the insulated panels within each role; and depositing an electroplated layer of copper within each hole which adheres to the electroless deposition and electrically interconnects the circuits intersected by the opening.

References Cited

UNITED STATES PATENTS

| | | | |
|---|---|---|---|
| 2,849,298 | 8/1958 | Werberig | 156—3 |
| 3,107,414 | 10/1963 | Sterling | 174—68.5 XR |
| 3,194,681 | 7/1965 | Nicholson et al. | 204—15 XR |
| 3,235,942 | 2/1966 | Howell et al. | 174—68.5 XR |
| 3,102,213 | 8/1963 | Bedson et al. | 174—68.5 |
| 874,374 | 12/1907 | Muller | 204—15 |
| 2,971,249 | 2/1961 | Anderson et al. | 204—15 |
| 3,296,099 | 1/1967 | Dinella. | |
| 3,301,939 | 1/1967 | Kasnow | 204—223 |

FOREIGN PATENTS

| | | | |
|---|---|---|---|
| 598,722 | 5/1960 | Canada. | |

DARRELL L. CLAY, Primary Examiner

U.S. Cl. X.R.

29—625; 204—15, 38, 223

PO-1050
(5/69)

UNITED STATES PATENT OFFICE
CERTIFICATE OF CORRECTION

Patent No. 3,532,801 Dated October 6, 1970

Inventor(s) John P. Faulkner

It is certified that error appears in the above-identified patent and that said Letters Patent are hereby corrected as shown below:

Col. 6, line 26, after "next" and before "is" insert --step--.

Col. 9, line 38, "circuts" should read --circuits--.

Col.10, line 29, "that" should read --than--;

line 54, after "the" add --openings.--;

line 73, "role" should read --hole--.

SIGNED AND
SEALED
DEC 29 1970

(SEAL)
Attest:

Edward M. Fletcher, Jr.
Attesting Officer

WILLIAM E. SCHUYLER, JR.
Commissioner of Patents